(12) United States Patent
Yang

(10) Patent No.: US 7,977,017 B2
(45) Date of Patent: Jul. 12, 2011

(54) METHOD TO RECOVER THE EXPOSURE SENSITIVITY OF CHEMICALLY AMPLIFIED RESINS FROM POST COAT DELAY EFFECT

(75) Inventor: Baorui Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/917,571

(22) Filed: Nov. 2, 2010

(65) Prior Publication Data

US 2011/0045389 A1     Feb. 24, 2011

Related U.S. Application Data

(60) Continuation of application No. 11/092,370, filed on Mar. 29, 2005, now Pat. No. 7,826,033, which is a division of application No. 10/391,708, filed on Mar. 19, 2003, now Pat. No. 7,147,973.

(51) Int. Cl.
    *G03F 9/00*     (2006.01)

(52) U.S. Cl. ................................ 430/5; 430/30; 430/330

(58) Field of Classification Search ................ 430/5, 30, 430/330
    See application file for complete search history.

(56) References Cited

U.S. PATENT DOCUMENTS

| 5,723,259 | A | 3/1998 | Oikawa et al. |
| 5,935,740 | A | 8/1999 | Pierrat |
| 6,107,002 | A | 8/2000 | Holscher et al. |
| 6,297,879 | B1 | 10/2001 | Yang et al. |
| 6,383,723 | B1 | 5/2002 | Iyer et al. |
| 6,441,351 | B2 | 8/2002 | Hayasaki et al. |
| 6,709,523 | B1 | 3/2004 | Toshima et al. |
| 2002/0050572 | A1 | 5/2002 | Nagahashi et al. |
| 2002/0076626 | A1 | 6/2002 | Montgomery et al. |
| 2002/0119397 | A1 | 8/2002 | Rolfson |
| 2002/0136966 | A1 | 9/2002 | Shinagawa et al. |

*Primary Examiner* — Christopher G Young
(74) *Attorney, Agent, or Firm* — Whyte Hirschboeck Dudek SC

(57) ABSTRACT

Methods of fabricating a photomask, methods of treating a chemically amplified resist-coated photomask blank, a photomask blank resulting from the methods, and systems for fabricating a photomask are provided. The method is useful for recovering the exposure sensitivity of a chemically amplified resist disposed on a photomask blank from a post-coat delay effect.

24 Claims, 4 Drawing Sheets

US 7,977,017 B2

METHOD TO RECOVER THE EXPOSURE SENSITIVITY OF CHEMICALLY AMPLIFIED RESINS FROM POST COAT DELAY EFFECT

CROSS REFERENCE TO RELATED APPLICATION

This application is a continuation of U.S. patent application Ser. No. 11/092,370, filed Mar. 29, 2005 now U.S. Pat. No. 7,826,033, which is a divisional of U.S. patent application Ser. No. 10/391,708, filed Mar. 19, 2003 now U.S. Pat. No. 7,147,973.

FIELD OF THE INVENTION

The invention relates generally to semiconductor processing methods, and more particularly to processes for fabricating a photomask that can be used in a photolithography process.

BACKGROUND OF THE INVENTION

Photolithography using a patterned masking layer is commonly used for formation of electronic components such as semiconductor integrated circuits. A pattern is transferred to a reactive photoresist layer on the semiconductor substrate by exposure of the patterned masking layer overlying the substrate to light or other energy source (such as ultraviolet light or electron beam radiation) which passes through open areas of the patterned masking layer.

The masking layer can be, for example a photomask or reticle, prepared from a photomask blank that typically comprises a thin layer of an opaque or nontransparent material, typically a metal-containing material such as a chromium-, molybdenum- or tungsten-containing material, deposited on a transparent plate of glass or quartz by sputtering or vacuum evaporation, for example. A pattern can be formed on the photomask blank structure by standard photolithography processes to selectively remove portions of the nontransparent layer (e.g., opaque chromium film) and create open areas. The pattern can be etched, for example, by forming a photoresist material over the nontransparent layer, forming a pattern in the photoresist material with an electron beam or laser beam, and transferring the pattern to the underlying nontransparent material with an etch that removes exposed portions of the nontransparent material.

With the fast pace of reduction of the micro-lithography design rule and the significant increase of data volume, the requirement on critical dimension ("CD") control and throughput on a photomask manufacture is becoming more and more challenging. Currently, photomasks are patterned with either 50 kV e-beam or laser pattern generation tools, and chemically amplified photoresists ("CA resists") that are sensitive to shorter wavelengths of light are being used to reduce the beam exposure (dose) and settling times, thereby improving the throughput of photomask pattern exposure. CA resists are more sensitive to radiation than non-chemically amplified resists such as ZEP-7000, thus needing a smaller dose of radiation (e.g., 8-9 μcoulomb versus about 25 μcoulomb) and a shorter development time.

Typical CA resists are composed of an acid generator that produces acid upon exposure to radiation (e.g., ultraviolet (UV) light, laser light, X-rays, electron beam), and acid-labile compounds or polymers that have changed solubility in a developer solvent through acid-catalyzed reactions. The irradiated area forms an image in the CA resist, and an annealing step (post exposure bake, or PEB) is performed after exposure. The photoresist is then exposed to a developing solvent to remove portions of the resist, the underlying opaque chrome or other nontransparent layer is etched, and the CA resist is removed. The patterned photomask is used to transfer a pattern to a photoresist layer disposed on a wafer during a fabrication step. The patterned photomask layer is exposed to blanket radiation that passes through open areas of the photomask layer onto the surface of the photoresist. The photoresist is then developed providing open areas exposing a material layer on the wafer. A fabrication step, for example, an ion implantation or an etch of the material layer, can be performed to form an underlying semiconductor device structure.

Ideally, it is advantageous to coat the photomask blank with a CA resist and immediately expose the resist on the blank. However, in practice, resist-coated blanks are often stored for several hours up to weeks before exposure. A difficulty with the use of CA resists is the change in stability and radiation dose sensitivity that occurs when a CA resist is coated on a substrate that is left standing inside or outside an irradiation apparatus. This effect is commonly known as "post coat delay" (PCD) effect.

Development of CA resists depends on the catalytic action of the acid generator, and if acid loss (neutralization) occurs, which decreases the radiation dose sensitivity of the resist, abnormalities will occur during pattern formation resulting in a significant difference between critical dimensions (CD) (i.e., minimum feature dimensions) of the patterned features compared to the required pattern dimensions. The acid loss is believed to be due to the presence of nitrogen-containing compounds such as atmospheric ammonia or ammonium ions, which neutralize the acid generator resulting in incomplete solubility of the resist, thus limiting shelf life of a photomask blank with an applied CA resist layer.

Typically, to compensate for the loss in sensitivity, the amount of decrease in dose sensitivity over time is estimated and the exposure process is adjusted accordingly. The relative dose sensitivity of the CA resist layer can be determined through experimentation and/or theoretical calculation. The difference in dose sensitivity may be a linear function of time difference between exposure of regions, a logarithmic difference, or related by some other mathematical correlation, depending on the type of radiation utilized, the type of resist utilized, and the tolerance for differences in minimum feature size between a first blank and a second blank.

Several methods have been used in an attempt to extend the shelf time or length of time a photomask substrate with a CA resist applied can be stored prior to exposure to the imaging/patterning radiation. Such methods have included the use of protective coatings and treatment with oxygen plasma to reduce the exposure of a CA resist to nitrogen-containing compounds. While use of these known methods produces some improvement over an untreated substrate, significant profile defects are still evident.

It would be desirable to develop a process for reducing the PCD effect on a chemically amplified (CA) resist coating disposed on a substrate such as a photomask blank.

SUMMARY OF THE INVENTION

The present invention provides methods of fabricating a photomask, methods of treating a chemically amplified resist-coated photomask blank, a photomask blank resulting from the methods, and systems for fabricating a photomask.

In one aspect, the invention provides, in a method of fabricating a photomask, a method of recovering exposure sensitivity of a chemically amplified resist disposed on a photomask blank from a post-coat delay effect. In one embodiment, the method comprises heating the photomask blank to dehydrate the resist, and cooling the photomask blank in a nitrogen-purged environment to about room temperature, such that the resist has a level of exposure sensitivity approximate to the resist as when initially applied onto the photomask blank; and patterning an image into the photoresist. For the heating step, for example, the resist-coated photomask blank can be positioned in a chamber that is heated to up to about 80° C. above room temperature or, in a preferred embodiment, the photomask blank can be supported on a temperature-controllable substrate (e.g., hotplate) and heated to about 90-180° C. for up to about 30 minutes. In the cooling step, for example, the heated photomask blank can be positioned in a nitrogen-purged chamber on a chill plate and cooled to about room temperature for about 10-30 minutes or more. In a preferred cooling step, the heated photomask blank is positioned in a nitrogen-purged chamber at about room temperature and cooled over an extended time period of about 6-12 hours.

In another aspect, the invention provides a method of treating a chemically amplified resist-coated photomask blank. In one embodiment, the method comprises heating the photomask blank to dehydrate the chemically-amplified layer, prior to patterning the resist. The treated resist layer possesses a level of exposure sensitivity approximate to the level of the resist when initially coated onto the photomask blank.

In another aspect, the invention provides a system for fabricating a photomask. In one embodiment, the system comprises a unit for treating a chemically amplified resist layer disposed on a photomask blank prior to patterning the resist layer, the treating unit comprising: means for supporting the photomask blank within a chamber of the treating unit, and a heating element (means). In one embodiment of the system, the heating means comprises an apparatus operable to heat the chamber to an elevated temperature. In another embodiment, the system comprises a heating element incorporated into the supporting means, which preferably comprises a temperature controllable plate having concentric heaters disposed on a plate with the temperature of each of the heaters being controlled independently.

The system can further comprise a unit for cooling the resist layer on the photomask blank, the cooling unit comprising: means for supporting the photomask blank within a chamber of the cooling unit; means for purging nitrogen from the chamber; and a cooling element (means). In one embodiment, the cooling means comprises an apparatus operable to cool the chamber to at least about room temperature. In another embodiment, the system comprises a cooling element incorporated into the supporting means, for example, a chill plate.

In an embodiment of a system according to the invention, a treating unit is provided that comprises a support platform for the photomask blank that incorporates a temperature adjustable element that can provide both heating and cooling; and a mechanism for purging nitrogen from the chamber. In another embodiment, the treating unit comprises a support for the photomask blank that incorporates an adjustable heating element; a device for maintaining the temperature of the chamber at about room temperature; and a mechanism for purging nitrogen from the chamber. The temperature controlled chamber can be used to maintain the temperature of the chamber and a $N_2$-purged environment. The system can also be structured with a unit for heating the photomask blank and a separate unit for chilling the photomask blank before patterning.

In another aspect, the invention provides a photomask blank. In one embodiment, the photomask blank comprises an unpatterned, chemically-amplified resist layer coated on the photomask blank for an extended time and thus subjected to post coat delay effect, the resist layer being heat-treated and substantially dehydrated such that the resist has a level of exposure sensitivity approximate to the resist as when initially applied onto the photomask blank.

The present invention solves the problem of maintaining a uniform and reproducible pattern critical dimension in a CA resist from the time of application of the resist onto a substrate to and during a writing process for imaging a photomask. The process of the invention eliminates, or substantially reduces, the sensitivity of a CA photoresist to the environment and maintains the pattern critical dimension of the resist to extend the shelf life of the CA resist during storage in handling which may be for a time period up to weeks, and during direct write imaging of the photoresist by either optical or e-beam radiation. The process of the invention significantly improves the lithographic performance in terms of critical dimension and integrity of the photoresist. The invention advantageously eliminates unnecessary work to calibrate the post coat delay (PCD) effect, and increases the accuracy and reproducibility of CD performance.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIG. 1 illustrates a resist-coated photomask blank at a preliminary processing step. FIG. 2 depicts a heat treatment to dehydrate the resist layer on the photomask blank. FIG. 3 depicts a processing step to pattern the resist layer.

DETAILED DESCRIPTION OF THE PREFERRED EMBODIMENTS

The invention will be described generally with reference to the drawings for the purpose of illustrating the present preferred embodiments only and not for purposes of limiting the same. The figures illustrate processing steps for fabricating photomask in accordance with the present invention. It should be readily apparent that the processing steps are only a portion of the entire fabrication process.

In the current application, the terms "semiconductive substrate", "semiconductor substrate", "wafer fragment" or "wafer" will be understood to mean any construction comprising semiconductive material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure, including, but not limited to, the semiconductive substrates described above.

The terms "photomask blank" or "patterned masking layer," as used herein, refers to either a photomask or reticle as those terms are known and used in the art.

The present invention addresses and solves problems of deterioration of radiation dose sensitivity of a chemically amplified (CA) photoresist layer coated on a photomask blank.

Figure 1:
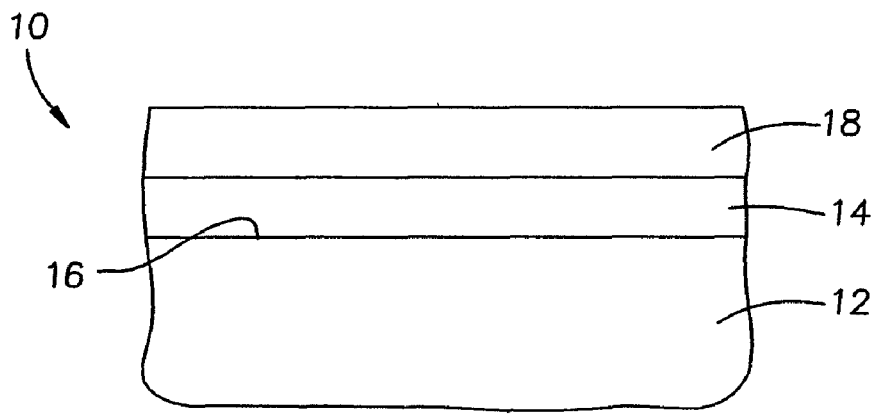
FIGS. 1-3 are diagrammatic cross-sectional views of a fragment of a photomask blank at sequential processing steps showing treatment of a chemically-amplified resist layer according to an embodiment of the method of the invention.
Figure 2:
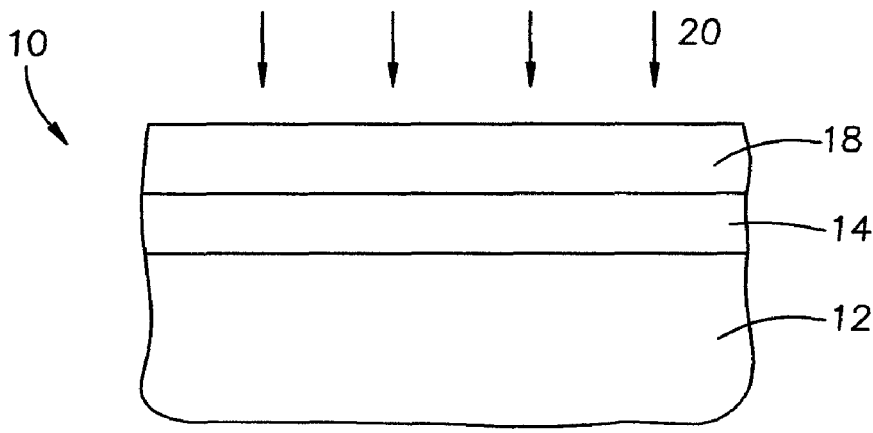
Figure 3:
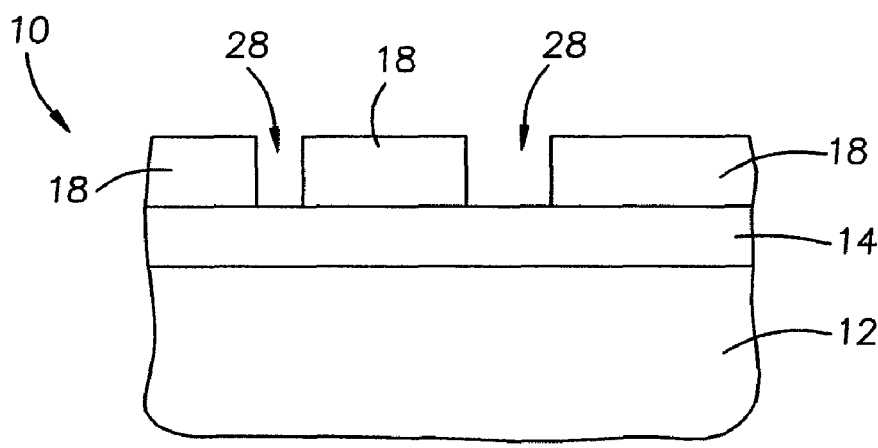

FIGS. 1-3 illustrate steps in an embodiment of a method of the invention. Referring to FIG. 1, a portion of an embodiment of a resist-coated binary photomask blank 10 is shown in cross-sectional view. The photomask blank 10 comprises a substrate 12 and a nontransparent film 14 formed on the surface 16 of the substrate 12, and a CA resist layer 18 formed on the nontransparent film layer 14. The substrate 12 typically comprises a quartz plate as the base of the mask blank, but can comprise a fluorinated quartz, borosilicate glass, soda lime glass, for example, or other substantially transparent material. The nontransparent film 14 typically comprises an opaque chrome-containing layer. The layer of opaque chromium is generally about 50-120 nm thick, with commercially available chromium thicknesses of about 50, 79, and 100 nm. The opaque chromium layer can be formed on the substrate by known techniques such as by reactive sputtering or vacuum evaporation. In the illustrated embodiment, an opaque chrome layer is disposed on a quartz plate, but it is understood that the nontransparent layer can be separated from the substrate by various intervening materials.

The CA photoresist layer 18 can be formed over the nontransparent layer 14 by suitable means known and used in the art, for example, by spinning the CA resist material onto the surface of the nontransparent layer. In the illustrated embodiment, the photoresist layer 18 is disposed on the nontransparent layer 14 but can be separated from the nontransparent layer by various materials, for example, an anti-reflective coating (ARC) (not shown), among others. Exemplary ARC materials include chrome oxynitride, titanium nitride, silicon nitride, or molybdenum silicide, or other material suitable for use to reduce light reflection from the substrate surface into the resist during photolithography. Inorganic or organic ARCs can be used. A suitable means of forming the ARC is to sputter it onto the surface of the layer.

The relative time difference between application of the CA resist layer 18 on the photomask blank and exposure of the CA resist to radiation development can be up to 24 hours or more to up to several weeks, for example, with a resulting deterioration in dose sensitivity of the CA resist.

According to the invention, prior to loading the resist-coated photomask blank 10 onto a pattern generation tool, a process step is conducted to recover or restore the dose sensitivity of the CA resist to about the dose sensitivity level of the CA resist as initially coated on the blank. It has been found that heating of the CA resist layer on the photomask blank prior to a radiation exposure step dehydrates the resist layer and eliminates the need to compensate for the PCD effect and the deterioration of the dose sensitivity of the resist material, which would otherwise require increasing the radiation dosage level during pattern generation. The heating step, depicted in FIG. 2, thus improves the reliability of the resist.

In one embodiment, the heating step comprises placing the CA resist-coated photomask blank 10 into a nitrogen-purged environment (e.g., container) at an elevated temperature effective to heat (arrows 20) the CA resist layer 18 and dehydrate the resist. Generally, the temperature within the nitrogen-purged environment is maintained at about 1° C. to about 80° C. above room temperature (i.e., 20° C.), or about 21° C. to about 100° C., with a preferred temperature of about 50° C. The resist-coated blank 10 can be maintained in the heated nitrogen-purged environment to dehydrate the CA layer, which can range from about 180 seconds up to about 180 minutes, for example, depending on the time period from when the resist was initially applied to the photomask blank, the thickness of the resist layer, the resist used, among other factors. The CA resist-coated blank can be stored in the heated, nitrogen-purged container for an extended period of time until a subsequent patterning step.

In a preferred embodiment, the heating step of the invention comprises a bake treatment of the CA resist-coated photomask blank 10 to dehydrate the CA resist layer 18 prior to exposing the CA resist layer to patterning radiation. The baking step (FIG. 2) comprises exposing the resist-coated photomask blank 10 to a temperature of about 90° C. to about 180° C., typically about 120° C. to about 140° C., for a time period of about 30 seconds to about 30 minutes, preferably about 5 to about 10 minutes. The bake step can be conducted in either a $N_2$-purged or atmospheric environment.

Figure 4:
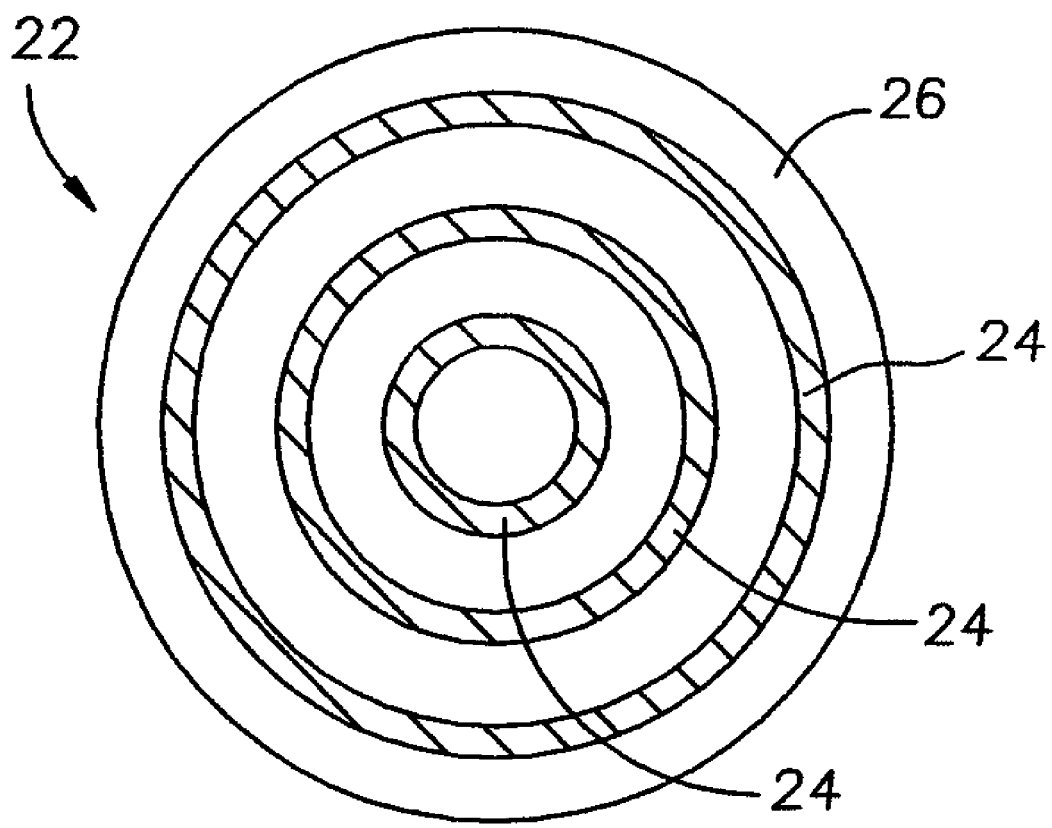
FIG. 4 is a top plan view of a prior art heating device.

The baking step can be conducted using the same equipment as utilized in a post-exposure bake (PEB) technique, which commonly employs a temperature-controlled plate (e.g., hotplate). A preferred bake unit is described, for example, in U.S. Pat. No. 6,441,351 (Hayasaki), the disclosure of which is incorporated by reference herein, and illustrated in FIG. 4. As shown, an exemplary bake unit 22 comprises three concentric heaters 24 provided in a heat equalizing plate 26. The temperature of each of the heaters 24 is controlled independently by an embedded thermocouple to provide a homogeneous bake treatment of the CA resist layer. A heat treatment device having a single ring heater as the heat source (not shown) can also be used.

The subsequent writing or patterning step typically takes about 3-20 hours and precise pattern placement on the CA resist layer 18 is a critical consideration in preparing the photomask. Normally, the actual alignment of the pattern on the CA resist layer is offset to some extent from the set data points for pattern placement, commonly known as a "registration offset." The thermal effect from a heated photomask blank can interfere with pattern placement accuracy and increase the registration offset.

To reduce such thermal effects, the photomask blank can be cooled, preferably to about room temperature (i.e., about 20-25° C.). The photomask blank can be cooled, for example, by transferring the heated photomask blank to a chill plate that is set at about room temperature to cool the photomask blank for about 10-30 minutes or more. In a preferred cooling step, the photomask blank is maintained in a nitrogen-purged environment (e.g., chamber, container) at about room temperature for an extended time period to acclimate the photomask blank to about room temperature, which is generally about 6 hours to up to about 12 hours. Cooling of the resist layer helps prevent distortion of the etch pattern and loss of image quality, and helps ensure that the pattern is properly transferred to the resist.

Referring to FIG. 3, the photomask blank 10 is then patterned by exposure of the CA resist to radiation in a direct write process that produces an image in the CA resist, for example, using laser-produced ultraviolet (UV) radiation, including deep ultraviolet (DUV) radiation, or electron beam (e-beam) radiation. Exposure of the CA photoresist to radiation will cause release of a catalyst (typically acid) within a region of the resist, which will subsequently catalyze chemical reactions to change the solubility of the region in a developer solvent relative to the solubility of an unexposed region.

After exposure of the CA resist to e-beam radiation, for example, the photomask blank is transported to a bake unit and "baked" at a suitable temperature to enhance (i.e. speed up) the chemical reaction within the CA resist so that the image will be transferred throughout the entire thickness of the CA resist and the pattern can be subsequently properly developed. The bake treatment is typically referred to as a "Post Exposure Bake" (PEB).

Subsequent to the bake step, the CA resist layer can be patterned and developed using standard lithography techniques to form openings 28 in the resist layer 18. Typically the CA resist layer is exposed to a developing solvent applied over the surface of the resist, for example, by a spinning technique. In the use of a positive CA resist, the radiation exposed areas of the resist are removed to produce open spaces 28 leaving non-irradiated areas in place over the nontransparent layer 14 (e.g., opaque chrome layer). In the use of a negative CA resist, the unexposed areas of the resist are removed, leaving the radiation exposed areas in place. A pattern transfer from the CA 18 resist into the underlying nontransparent layer 14 is then performed, typically using an anisotropic plasma dry etching technique, to create openings in the nontransparent layer that expose the substrate. The CA resist is then stripped away using known techniques in the art.

The resulting photomask is used to transfer a pattern to a photoresist layer disposed on a wafer during a fabrication step. The photomask is exposed to blanket radiation that passes through the open areas onto the surface of the photoresist. The photoresist is then developed providing open areas exposing the underlying material layer on the wafer, and an ion implantation or an etch of the material layer can be performed, for example, to form an underlying semiconductor device structure. The photomask can be utilized in the photolithography of a semiconductor device such as a logic device, microprocessor, DRAM, SRAM, and the like.

Subsequent processing may then be conducted on the semiconductor device structure, as known in the art.

Figure 5:
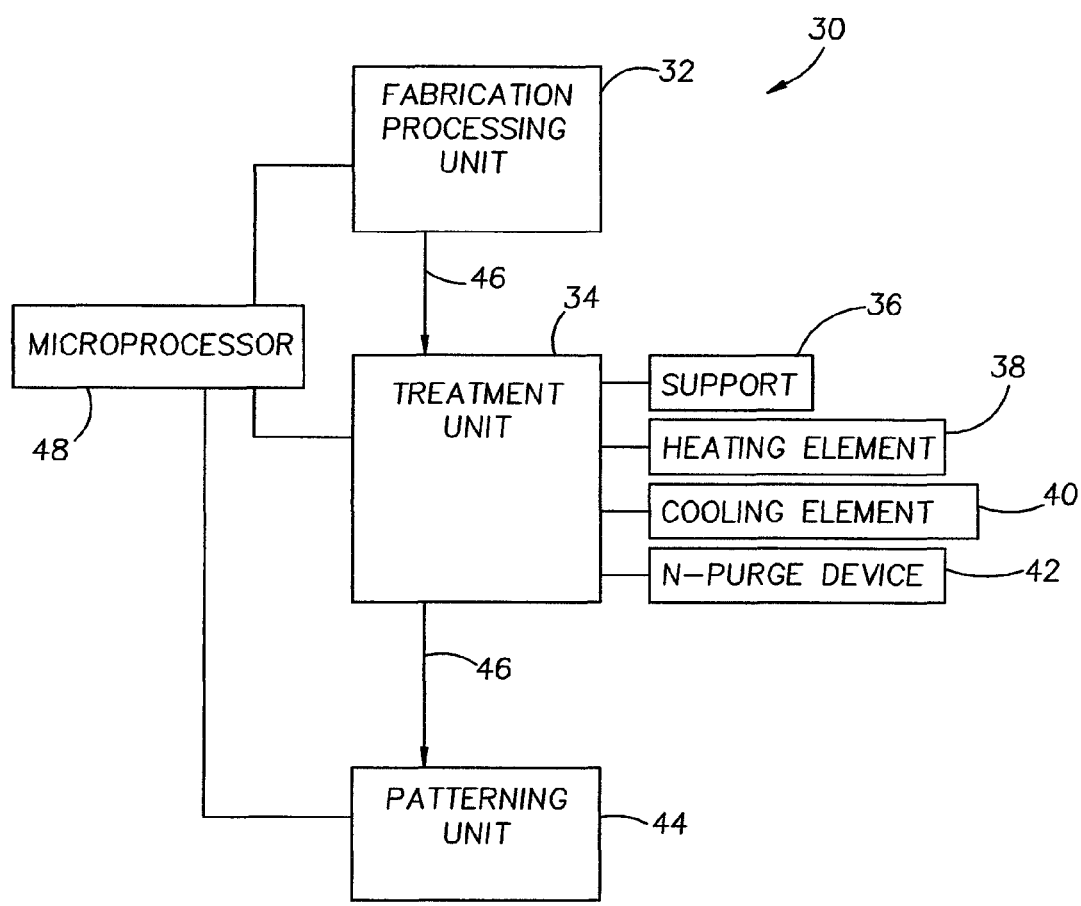
FIG. 5 is a block diagram of an embodiment of a system according to the invention incorporating a unit for treating a chemically amplified resist layer disposed on a photomask blank.

FIG. 5 is a diagram of an embodiment of a system 30 that can be utilized in implementing the method of the invention. The system 30 can include a processing unit 32 for fabricating the photomask blank; a treating unit 34 (chamber, etc.) comprising a support 36 for the photomask blank, a heating element 38, a chill or cooling element 40, and a nitrogen-purging apparatus 42; a processing unit 44 for patterning and developing the photoresist layer; and a conveyor mechanism 46 for conducting the photomask blank through the system. The various units can be electrically coupled to a microprocessor 48, which may be programmed to carry out particular functions as is known in the art. For example, a bake unit such as a hotplate within a heating chamber (or chill plate within a cooling chamber) can be connected to a controller such as a computer or other processor to control the temperature of the plate, etc.

Figure 6A:
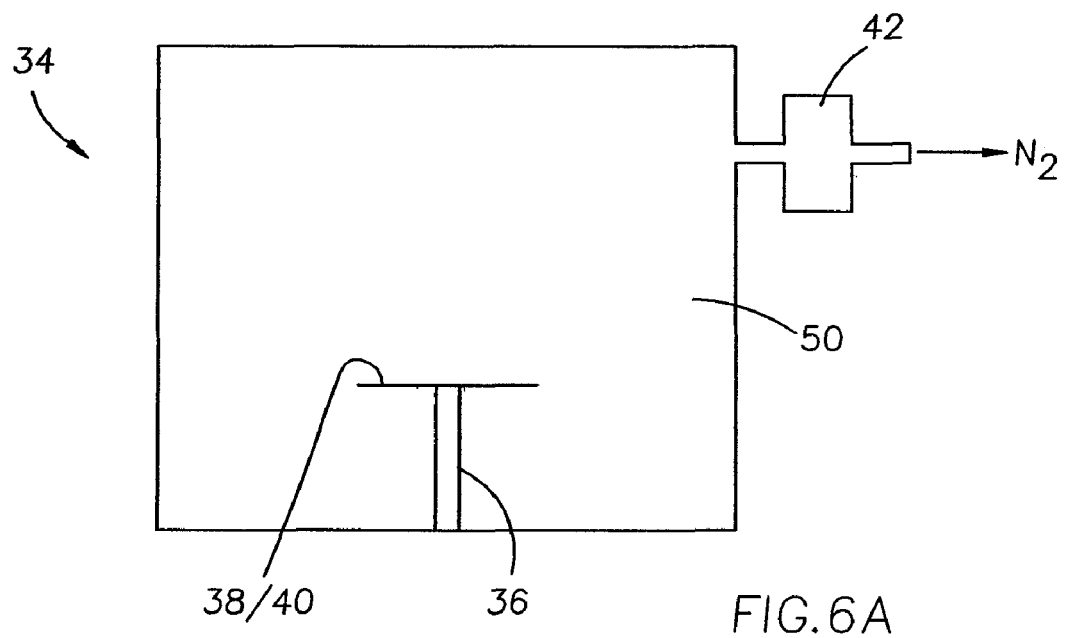
FIG. 6A-6B are depictions of embodiments of a treating unit that can be utilized in the system of FIG. 5.
Figure 6B:
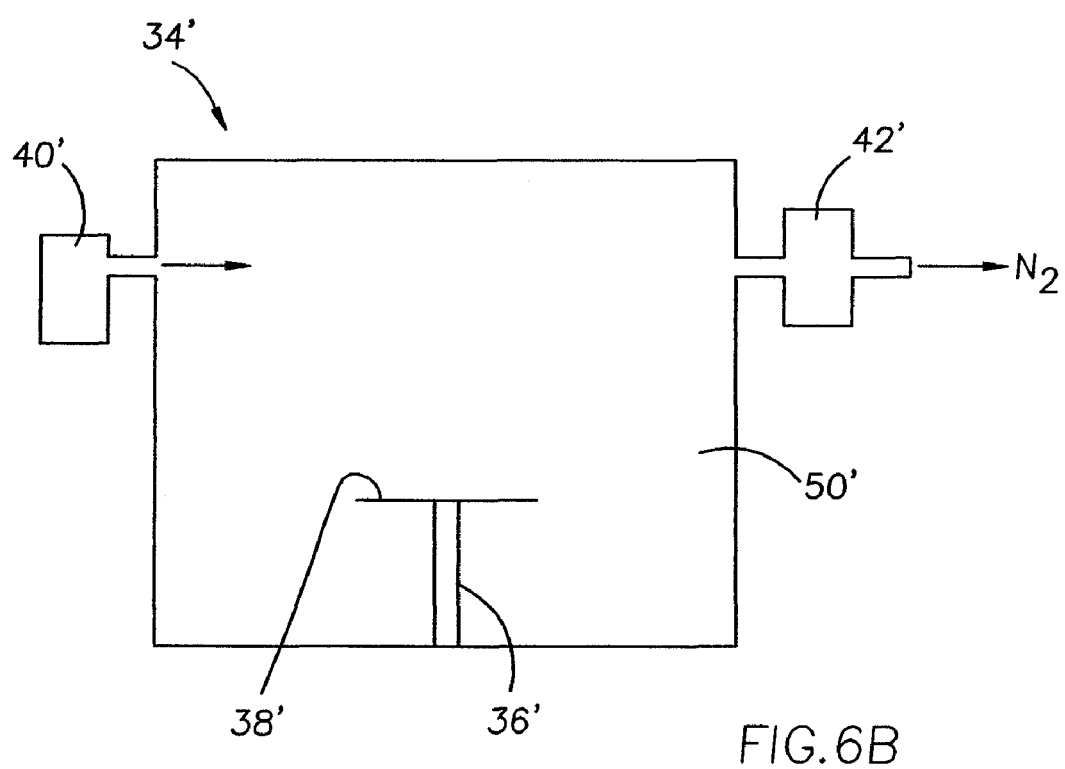

In one embodiment, depicted in FIG. 6A, the treating unit 34 is structured with a temperature controlled plate support 36 which temperature can be elevated or lowered to function as a heating element 38 and a cooling element 40, and a device 42 to purge nitrogen from the chamber 50. In a preferred embodiment, as depicted in FIG. 6B, the treating unit 34' can be structured with a bake unit in the form of a hotplate 38' as a support 36' for the photomask blank in the chamber 50', an interconnected chilling unit 40' to cool the chamber 50' to room temperature, and an interconnected device 42' operable to provide a nitrogen-purged atmosphere in the chamber 50'. In a simple application, the room temperature controlled chamber can provide both cooling and a $N_2$-purged environment.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a photomask blank, comprising:
   forming a chemically amplified resist material on a substrate, said resist material having an initial exposure sensitivity level; and
   exposing the resist material to radiation to form an image in the resist material;
   wherein after forming the resist material on the substrate and prior to exposing the resist material to radiation, the resist material is maintained in a heated environment purged of nitrogen to maintain exposure sensitivity level of said resist material at about said initial exposure sensitivity level.

2. The method of claim 1, wherein after forming the resist material on the substrate, heating the resist material to a temperature of about 21-100° C. for up to about 180 minutes and then maintaining the resist material in said heated environment.

3. The method of claim 1, wherein after forming the resist material on the substrate, heating the resist material to a temperature of about 90-180° C. for up to about 30 minutes and then maintaining the resist material in said heated environment.

4. A method of forming a photomask blank, comprising:
   forming a chemically amplified resist material on a substrate, said resist material having an initial exposure sensitivity level;
   heating the resist material; and
   exposing the resist material to radiation to form an image in the resist material;
   wherein after heating the resist material and prior to exposing the resist material to radiation, maintaining the resist material at about 20-25° C. in an environment purged of nitrogen to maintain exposure sensitivity level of said resist material at about said initial exposure sensitivity level.

5. The method of claim 4, wherein said heating comprises exposing the resist material to a temperature of about 21-100° C. for up to about 180 minutes.

6. The method of claim 4, wherein said heating comprises exposing the resist material to a temperature of about 90-180° C. for up to about 30 minutes.

7. A method of forming a photomask blank, comprising:
   forming a chemically amplified resist material on a substrate, said resist material having an initial exposure sensitivity level;
   heating the resist material to dehydrate the resist material;
   maintaining said resist material in a heated environment purged of nitrogen to maintain exposure sensitivity level of said resist material at about said initial exposure sensitivity level; and
   exposing the resist material to radiation to form an image in the resist material.

8. A method of forming a photomask blank, comprising:
forming a chemically amplified resist material on a substrate, said resist material having an initial exposure sensitivity level;
heating the resist material to dehydrate the resist material;
maintaining said resist material in a dehydrated state such that exposure sensitivity level of said resist material is maintained at about said initial exposure sensitivity level; and
exposing the resist material to radiation to form an image in the resist material.

9. The method of claim 8, wherein said heating comprises exposing the resist material to a temperature of about 21-100° C. for up to about 180 minutes in an environment purged of nitrogen.

10. The method of claim 8, wherein said heating comprises exposing the resist material to a temperature of about 90-180° C. for up to about 30 minutes.

11. The method of claim 10, wherein said heating is conducted in an environment purged of nitrogen.

12. The method of claim 10, wherein said heating is conducted in an atmospheric environment.

13. A method of forming a photomask blank, comprising:
forming a chemically amplified resist material on a substrate, said resist material having an initial exposure sensitivity level;
maintaining said resist material in a heated environment purged of nitrogen to maintain exposure sensitivity level of said resist material at about said initial exposure sensitivity level;
conveying the substrate to a processing unit for patterning the resist material; and
exposing the resist material to radiation to form an image in the resist material.

14. The method of claim 13, further comprising cooling the resist material prior to conveying the substrate to the processing unit.

15. A method of forming a photomask blank, comprising:
forming a chemically amplified resist material on a substrate, said resist material having an initial exposure sensitivity level;
heating the resist material to dehydrate the resist material;
cooling the resist material;
maintaining said resist material in an environment purged of nitrogen at about room temperature wherein exposure sensitivity level of said resist material is maintained at about said initial exposure sensitivity level; and
exposing the resist material to radiation to form an image in the resist material.

16. A method of forming a photomask blank, comprising:
forming a chemically amplified resist material on a substrate, said resist material having an initial exposure sensitivity level;
heating the resist material to dehydrate the resist material;
cooling the resist material to about room temperature by maintaining said resist material at about room temperature for up to about 12 hours, wherein exposure sensitivity level of said resist material is maintained at about said initial exposure sensitivity level; and
exposing the resist material to radiation to form an image in the resist material.

17. The method of claim 16, wherein said cooling is conducted by positioning said substrate with the heated resist material thereon, on a cooling device.

18. The method of claim 16, wherein said heating and cooling is conducted by positioning said substrate with the heated resist material thereon, on a temperature-controlled heating and cooling plate.

19. The method of claim 16, wherein said cooling is conducted by positioning said substrate with the heated resist material thereon, in an environment purged of nitrogen.

20. The method of claim 19, wherein said cooling is conducted at about 20-25° C. for about 6 to about 12 hours.

21. The method of claim 16, wherein said heating comprises exposing the resist material to a temperature of about 21° C. to up to about 180° C., and said cooling comprises cooling the resist material to about 20-25° C.

22. The method of claim 16, wherein said cooling the resist material is conducted in a dehydrating unit.

23. A method of forming a photomask blank, comprising:
forming a chemically amplified resist material on a substrate, said resist material having an initial exposure sensitivity level;
heating the resist material in a dehydrating unit to dehydrate the resist material;
cooling the resist material;
maintaining the resist material in a dehydrated state;
conveying the substrate to a processing unit for patterning the resist material; and
exposing the resist material to radiation to form an image in the resist material.

24. The method of claim 23, wherein said maintaining the resist material in a dehydrated state comprises maintaining the resist material at a temperature of about 20-25° C. in an atmosphere purged of nitrogen.

* * * * *